(12) United States Patent
Lim

(10) Patent No.: US 10,008,135 B2
(45) Date of Patent: Jun. 26, 2018

(54) FLEXIBLE DISPLAY DEVICE THAT CAN BE HYPER-EXTENDED

(71) Applicant: You Seob Lim, Goyang (KR)

(72) Inventor: You Seob Lim, Goyang (KR)

( * ) Notice: Subject to any disclaimer, the term of this patent is extended or adjusted under 35 U.S.C. 154(b) by 0 days. days.

(21) Appl. No.: 15/512,566

(22) PCT Filed: Sep. 30, 2015

(86) PCT No.: PCT/KR2015/010312
§ 371 (c)(1),
(2) Date: Mar. 19, 2017

(87) PCT Pub. No.: WO2016/048113
PCT Pub. Date: Mar. 31, 2016

(65) Prior Publication Data
US 2017/0243526 A1 Aug. 24, 2017

(30) Foreign Application Priority Data
Sep. 28, 2014 (KR) ........................ 10-2014-0129704

(51) Int. Cl.
*G06F 1/16* (2006.01)
*H05K 5/00* (2006.01)
(Continued)

(52) U.S. Cl.
CPC ........... *G09F 9/301* (2013.01); *H05K 5/0017* (2013.01); *H05K 5/0226* (2013.01); *H05K 5/03* (2013.01)

(58) Field of Classification Search
CPC ... G06F 1/1652; G06F 1/1626; H05K 5/0017; H05K 5/0226
(Continued)

(56) References Cited

U.S. PATENT DOCUMENTS 6,016,176 A * 1/2000 Kim .................. G02F 1/133305
349/158
7,808,550 B2 * 10/2010 Misawa ............... H04N 5/2251
348/333.01
(Continued)

FOREIGN PATENT DOCUMENTS

JP 2003-208112 A 7/2003
KR 10-0667981 A 1/2007
(Continued)

*Primary Examiner* — Anthony Haughton
(74) *Attorney, Agent, or Firm* — Patent Office of Dr. Chung Park

(57) ABSTRACT

The present invention relates to a flexible display device comprising: a fixed body in which a hinge shape is reflected; a flexible display device that is maintained to be freely folded or unfolded in a state in which one portion thereof is fixed to the fixed body, and the remaining unfixed end portion thereof is supported by the outer peripheral surface of the hinge; a perturbation penetration part for perturbation and support of the flexible display device that is maintained to be freely folded or unfolded, the perturbation penetration part being assembled to the hinge shape of the fixed body so as to be rotatable; and a cover plate having a perturbation stopper formed therein. Even though the cover plate is unfolded in excess of the angle for forming a complete flat surface, components associated with the flexible display device do not interfere with each other.

9 Claims, 16 Drawing Sheets

(51) Int. Cl.
*H05K 7/00* (2006.01)
*G09F 9/30* (2006.01)
*H05K 5/03* (2006.01)
*H05K 5/02* (2006.01)

(58) Field of Classification Search
USPC .............. 361/679.21–679.3, 679.55, 679.56; 455/575.1–575.9
See application file for complete search history.

(56) References Cited

U.S. PATENT DOCUMENTS

| | | | | |
|---|---|---|---|---|
| 8,385,055 B2* | 2/2013 | Kao | ...................... | G06F 1/1616 |
| | | | | 349/56 |
| 8,605,421 B2* | 12/2013 | Verschoor | ............. | G06F 1/1652 |
| | | | | 361/679.21 |
| 8,873,225 B2* | 10/2014 | Huitema | ............... | G06F 1/1615 |
| | | | | 345/168 |
| 9,294,597 B2* | 3/2016 | Tan | ..................... | H04M 1/0268 |
| 9,603,271 B2* | 3/2017 | Lee | ..................... | H05K 5/0017 |
| 2014/0213324 A1* | 7/2014 | Tan | .................... | H04M 1/0268 |
| | | | | 455/566 |

FOREIGN PATENT DOCUMENTS

| | | |
|---|---|---|
| KR | 10-2008-0012667 A | 8/2009 |
| KR | 10-2010-0092220 A | 8/2010 |
| KR | 10-2010-0062787 A | 1/2012 |
| KR | 10-2012-0092037 A | 8/2012 |
| KR | 10-2012-0068710 A | 1/2014 |
| KR | 10-2014-0015881 A | 2/2014 |

\* cited by examiner

FLEXIBLE DISPLAY DEVICE THAT CAN BE HYPER-EXTENDED

CROSS-REFERENCE TO PRIOR APPLICATIONS

This application is a national Stage Patent Application of PCT International Patent Application No. PCT/KR2015/010312, filed on Sep. 30, 2015 under 35 U.S.C. § 371, which claims priority of Korean Patent Application No. 10-2014-0129704, filed on Sep. 28, 2014, which are all hereby incorporated by reference in their entirety.

TECHNICAL FIELD

The present invention relates to a foldable flexible display apparatus to which flexible display means, such as a flexible panel or electronic paper capable of free folding and unfolding, has been applied and, more particularly, to a flexible display apparatus capable of over-unfolding, wherein in flexible display means having one portion fixed and having the other portion that is not fixed supported by the outer surface of a hinge and freely folded and unfolded, a surface on which an image is displayed unfolded to form a complete plane state and is then additionally unfolded in the same unfolding direction so that the surface on which the image is displayed forms a V shape.

BACKGROUND ART

A display device occupies an important portion in electronic devices, including a video device, a notebook, a monitor and a mobile communication device. In addition to a conventional LCD panel that maintains a sheet form, flexible display devices capable of bending and folding, such as a flexible panel and electronic paper, are shown.

In applying the flexible display device to a video device and a communication device, a plurality of patents was suggested, including a patent (Korean Patent Application No. 10-2008-0012667) of a form in which an image display surface is directed toward an outside surface and a central portion is directly folded in the state in which the image display surface and the outside surface turn against each other, a patent (Korean Patent. Application No. 10-2010-0062787) into which a hinge for absorbing a change in the length by changing the direction of the end of a flexible display device on one side to the inside using a roller within a edge located on the side opposite the hinge without directly fixing the end on one side and then applying a spring to the changed end of the flexible display device on one side has been incorporated, and a patent (Korean Patent Application No. 10-2012-0068710) to which a link member for absorbing a change in the length of a portion corresponding to the length of the circumference of a edge portion, which is folded upon unfolding and folding, by applying the link member that substitutes the function of a hinge has been applied.

However, the patent (Korean Patent Application No. 10-2008-0012667) of a form in which the central portion is directly folded in the state in which the image display surface is directed toward the outside surface and they have been turned against each other may maintain the state, such as an unfolded notebook, but may fall backward due to the instability of the distribution of weight. Furthermore, there is a possibility that a portion where bending is generated or a fixed end on any one side may be damaged due to the lack of the expandability of the flexible display device and related parts.

In the patent (Korean Patent Application No. 10-2010-0062787) into which the hinge has been incorporated and the patent (Korean Patent Application No. 10-2012-0068710) to which the link member has been applied, the flexible display device and related parts are not damaged in the place where bending is generated, but over-unfolding in the state, such as an unfolded notebook, is impossible.

DISCLOSURE

Technical Problem

An object of the present invention is to provide a flexible display apparatus capable of over-unfolding, wherein in flexible display means having one portion fixed and having the other portion that is not fixed freely folded and unfolded in the state in which a surface opposite a surface on which an image is displayed has been supported by the outer surface of a hinge, the surface on which the image is displayed is unfolded to form a complete plane state and then additionally unfolded in the same unfolding direction after the complete plane state so that the surface on which the image is displayed forms a V shape.

Technical Solution

In accordance with an embodiment of the present invention for achieving the objects, a flexible display apparatus may include a fixed body in which a hinge shape has been incorporated into an edge on one side thereof and into which a shape from which a first space for interference avoidance, that is, a possible area overlap portion neighboring a hinge, has been removed has been incorporated in order to avoid area overlap with an element which is generated due to the over-unfolding of the element rotatably assembled with the hinge, flexible display means which is folded and unfolded by the turning of the element rotatably assembled with the hinge of the fixed body in the state in which one portion has been fixed to the fixed body and a surface opposite a surface on which an image is displayed has been supported by the outer surface of the hinge in the other portion that is not fixed, a cover plate which is an element rotatably assembled with the hinge of the fixed body and in which a shape for hinge coupling with the fixed body has been formed on one side thereof, a sliding latch jaw for the support and sliding operation of the non-fixed portion of the flexible display means has been formed, and a shape from which a second space for interference avoidance, that is, the possible area overlap portion of the sliding latch jaw, has been removed has been incorporated into the end of the sliding latch jaw neighboring the hinge on one side thereof in order to avoid area overlap between a portion where the curved surface of the flexible display means, which is formed upon over-unfolding, and the area of the sliding latch jaw, a fixing plate which is fixed to the fixed body while pressing the top circumference of the flexible display means located in the fixed body out of the portion where the curved surface of the flexible display means is formed upon over-unfolding, and a folding detection sensor which is assembled with the fixed body and senses the folding and unfolding of the hinge.

Advantageous Effects

As described above, in accordance with an embodiment of the present invention, in the state in which a surface on which an image is displayed has been unfolded to form a complete plane state in the flexible display means having one portion fixed and having the other portion that is not fixed freely folded and unfolded in the state in which a surface opposite the surface on which the image is displayed has been supported by the outer surface of the hinge, after the cover plate is unfolded, the cover plate is additionally unfolded in the same unfolding direction so that the surface on which then image is displayed forms a V shape, such as the state of a notebook. Accordingly, over-unfolding is made possible, and the following advantages are achieved.

First, a user's stereoscopic watching is made possible because a surface on which an image is displayed is not a complete plane, but can be adjusted to have a smooth V shape based on the rotation axis of the hinge.

Second, in addition to portable convenience in which the flexible display means is folded and carried, one portion of a surface on which an image is displayed can be inclined and erected like a notebook, and the other portion of the surface can maintain an unfolded posture to facilitate a user's touch input.

BEST MODE

Figure 1:
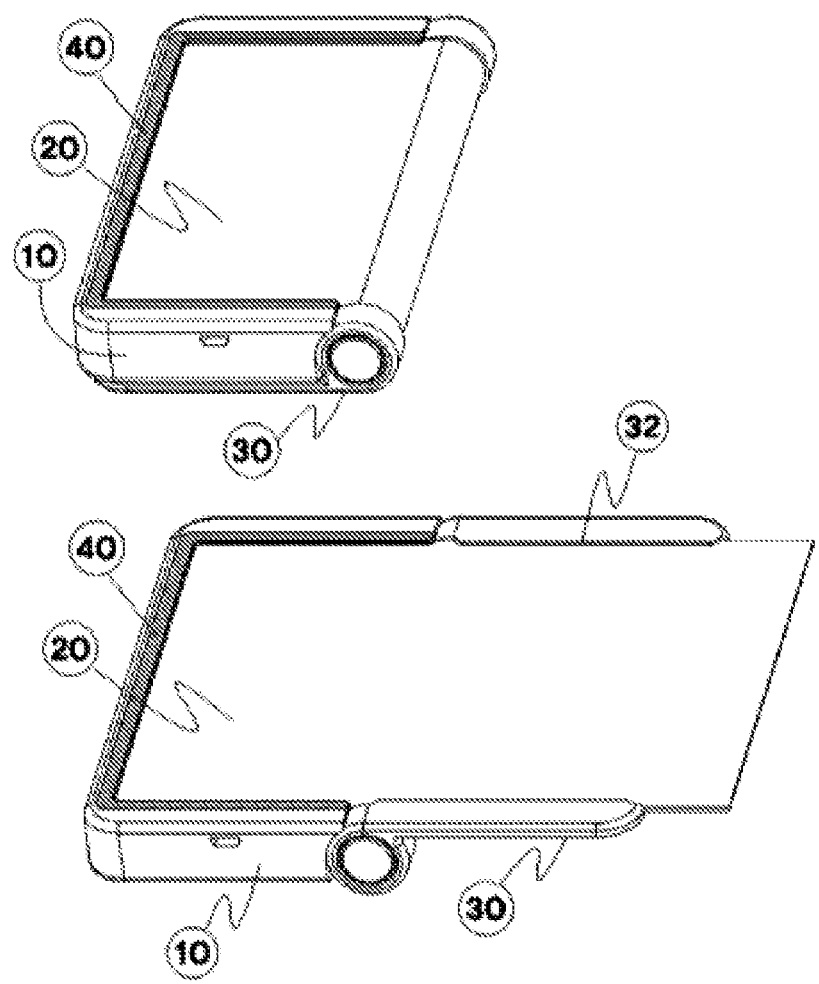
FIG. 1 is an exemplary diagram of flexible display means in which over-unfolding having an angle greater than an angle at which full unfolding is formed is not permitted.

Hereinafter, preferred embodiments of the present invention are described in detail with reference to the accompanying drawings. Terms used in this specification are provided to describe the embodiments and are not intended to limit the present invention. In the specification, the singular form, unless specially described otherwise, may include the plural form. Furthermore, reference numerals proposed according to the sequence of description are not necessarily limited to a sequence described herein because they are based on the preferred embodiments. FIG. 1 is an exemplary diagram of flexible display means in which over-unfolding having an angle greater than an angle at which full unfolding is formed is not permitted, and FIG. 2 is a conceptual diagram showing a change for each application section according to a change in the hinge unfolding angle of the flexible display means 20 applied to FIG. 1.

As shown in FIG. 1, a flexible display apparatus to which the flexible display means 20 has been applied is configured to include a fixed body 10 into which a hinge shape has been incorporated at an edge on one side thereof, the flexible display means 20 in which one portion is fixed to the fixed body 10 and the other portion that is not fixed is folded and unfolded in the state in which a surface opposite a surface on which an image is displayed has been supported by the outer surface of the hinge, a cover plate 30 in which a shape for hinge coupling with the fixed body 10 is formed on one side and a sliding latch jaw 31 for the support and sliding operation of the non-fixed portion of the flexible display means 20 has been formed and which is rotatably assembled with the hinge of the fixed body 10, and a fixing plate 40 which is fixed to the fixed body 10 while presses the top circumference of the flexible display means 20 located in the fixed body 10. As each sliding latch jaw 31 guides the sliding motion of the non-fixed portion of the flexible display means 20, the terms sliding latch jaw and sliding guide are used interchangeably.

Figure 2:
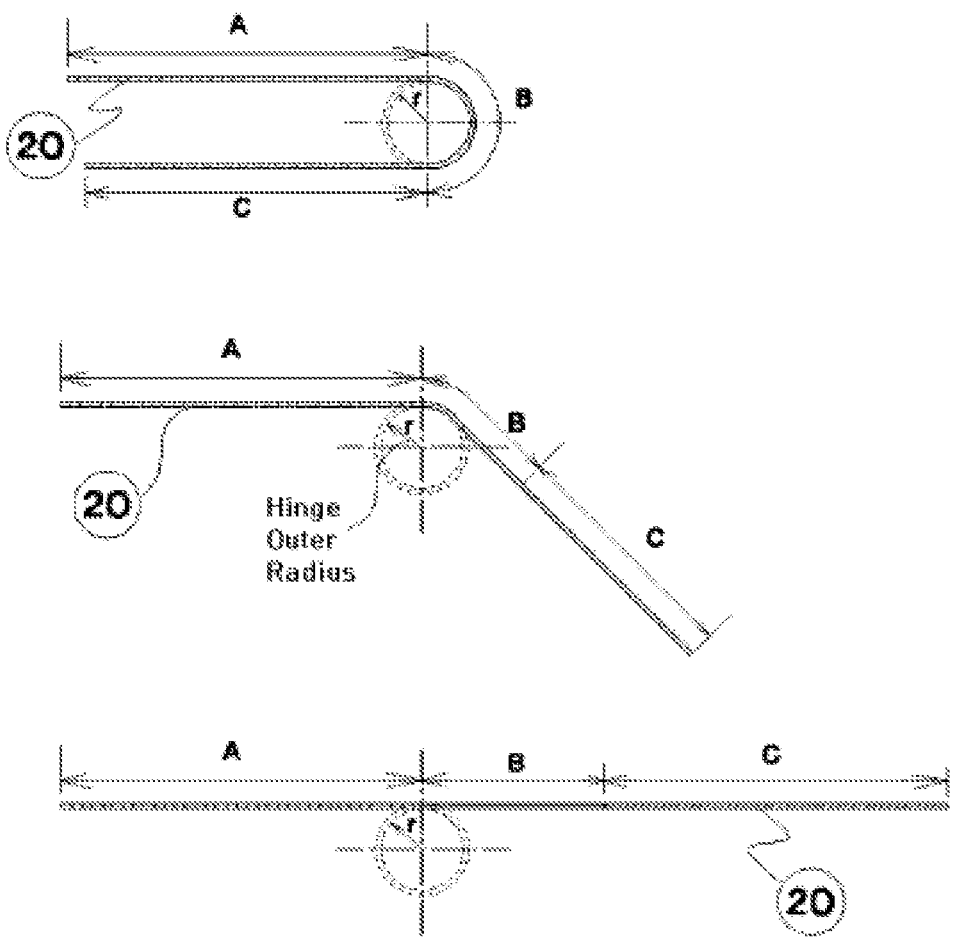
FIG. 2 is a conceptual diagram showing a change for each application section according to a change in the hinge unfolding angle of the flexible display means applied to FIG. 1.

In the flexible display means 20 of FIG. 2, a portion A is a portion fixed to the fixed body 10 and incapable of folding and unfolding. A portion B is a portion in which one portion is supported by the outer surface of the hinge depending on a change in the unfolding angle of the cover plate 30 while maintaining a curved surface and the other portion is changed into a plane state out of the outer surface of the hinge and supported and subjected to sliding operation by the cover plate and in which a curved surface is changed into a plane and vice versa. The remaining portion C is a portion which always maintains the plane state without being influenced by an unfolding angle of the cover plate and which is subjected to sliding operation and supported by the cover plate 30.

As shown in FIG. 2, when the cover plate 30 rotatably assembled with the hinge of the fixed body 10 is turned, the portion of the flexible display means 20 which is brought in contact with and supported by the outer surface of the hinge has a maximum in the full folding state and has a minimum value in the full unfolding state in which a surface on which an image is displayed forms a complete plane.

From FIGS. 1 and 2, it may be seen that the change of the cover plate 30 into the full unfolding state which a surface on which an image is displayed forms a complete plane after the cover plate 30 is unfolded in the state in which the cover plate 30 has been folded to the fixed body 10 can be easily performed unless an intentional limiting factor is not applied in structure.

Figure 3:
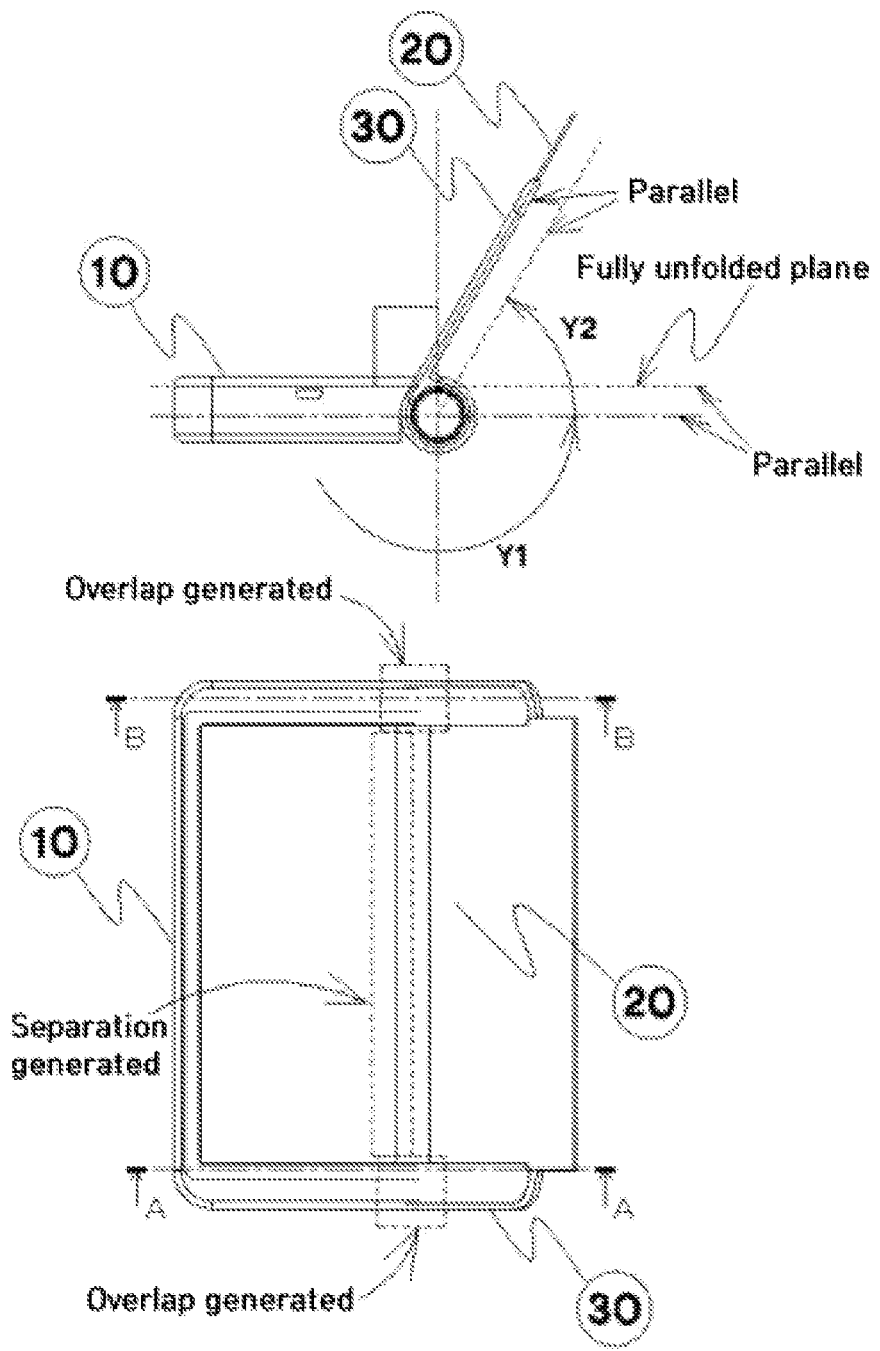
FIG. 3 is a front view and plan view showing an overlapped portion and separated portion generated when the additional unfolding of a cover plate is forcedly performed in the same unfolding direction after the cover plate is unfolded in the state in which the flexible display means has formed a complete plane in the case of FIG. 1.
Figure 4:
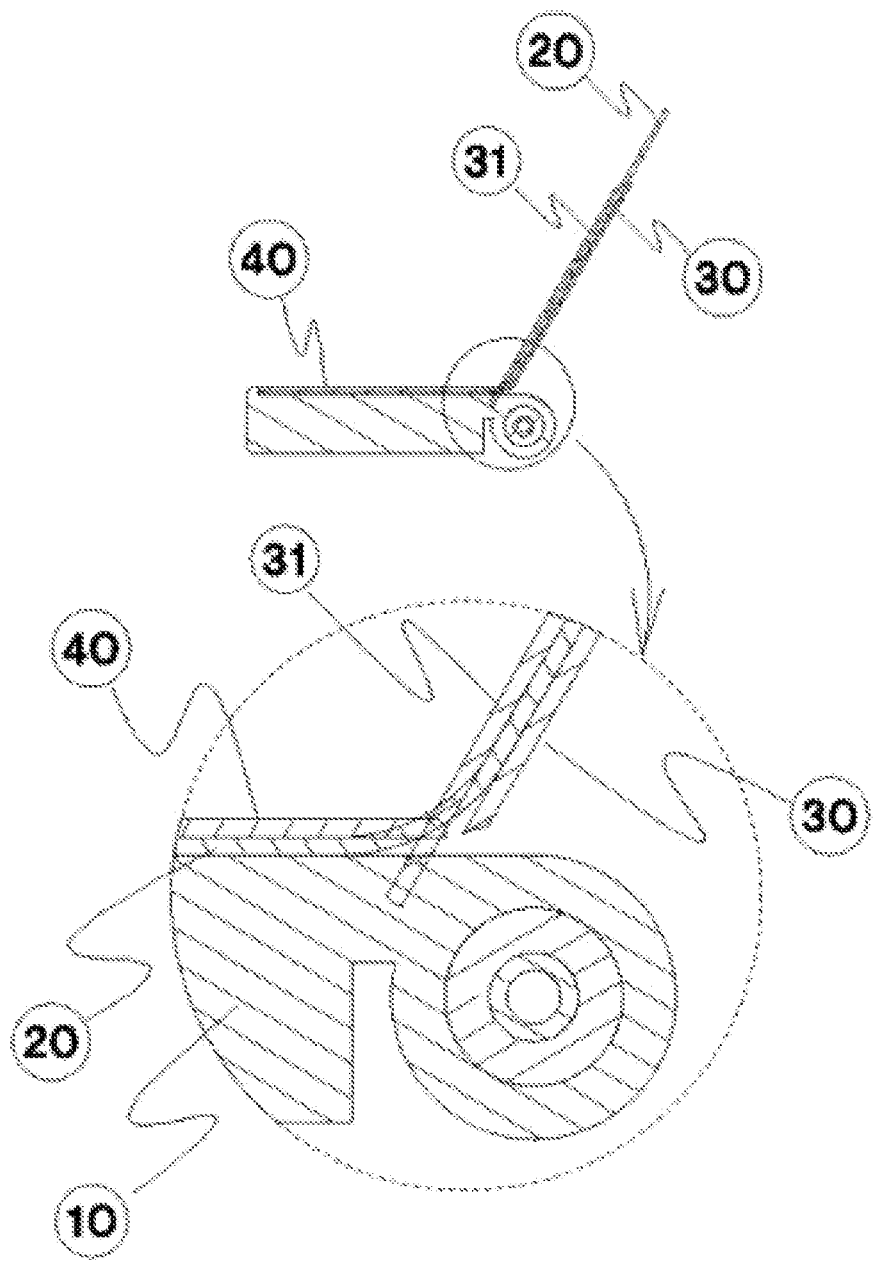
FIG. 4 is a cross-sectional view of a cross section portion A-A of FIG. 3 and a partial detailed view showing that overlap is generated.
Figure 5:
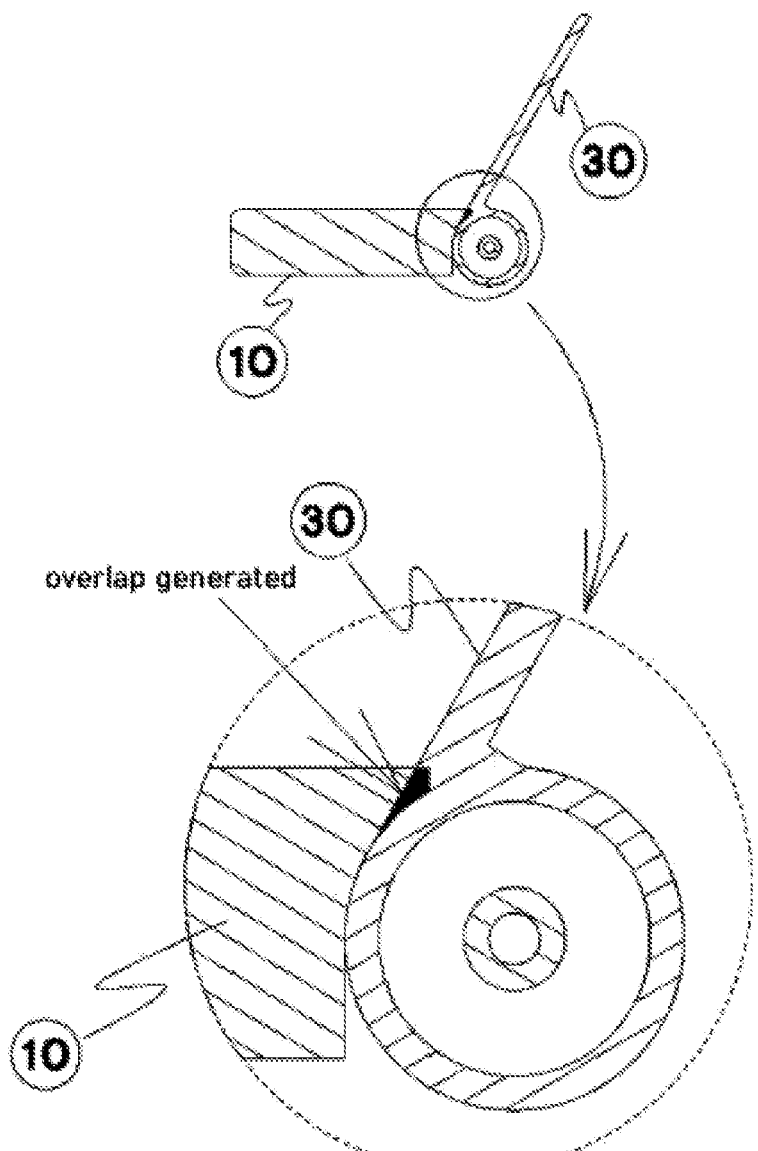
FIG. 5 is a cross-sectional view of a cross section portion B-B of FIG. 3 and a partial detailed view showing that overlap is generated.
Figure 6:
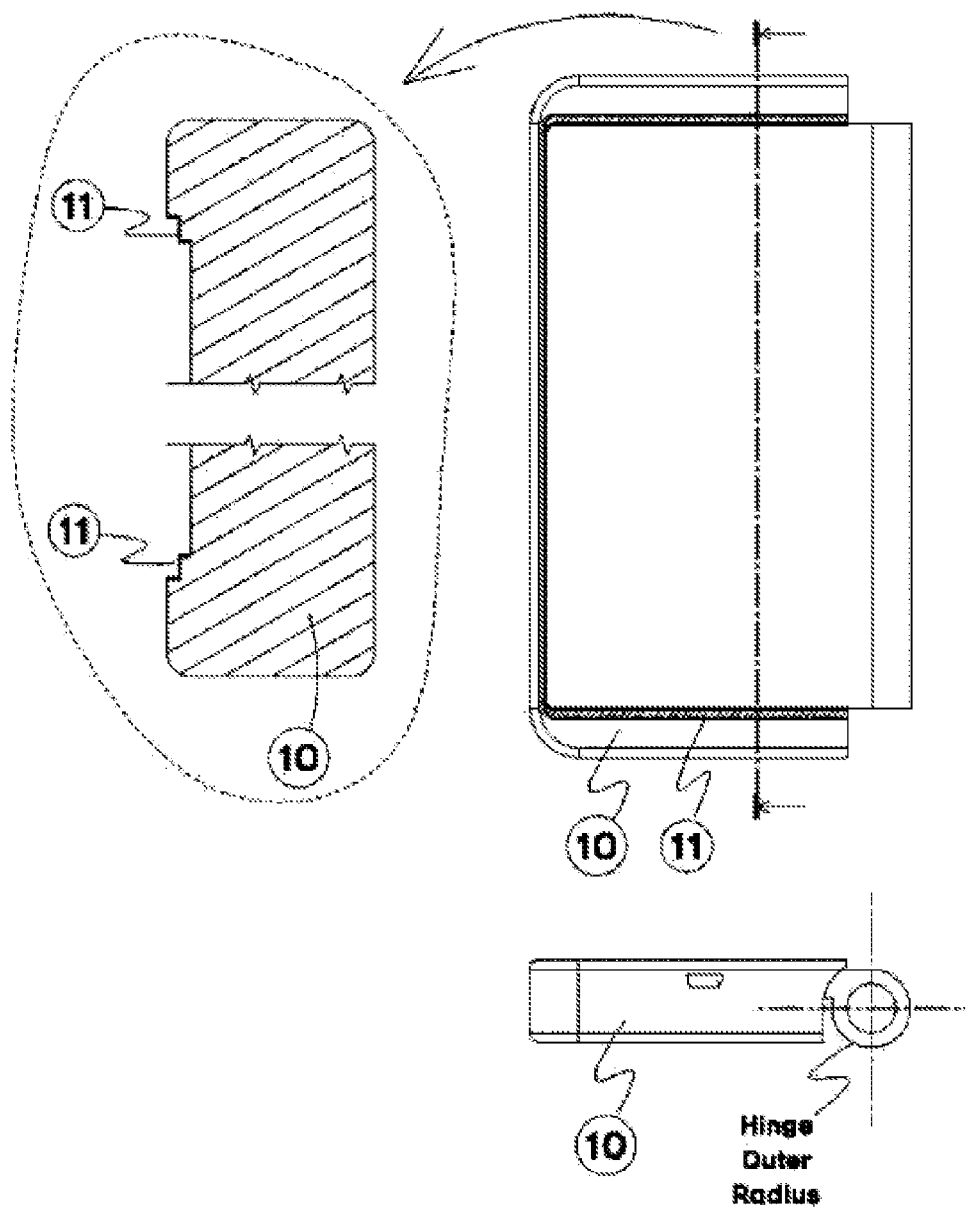
FIG. 6 is a plan view, front view and cross-sectional view of a fixed body in which overlap is generated upon over-unfolding in FIG. 1.
Figure 7:
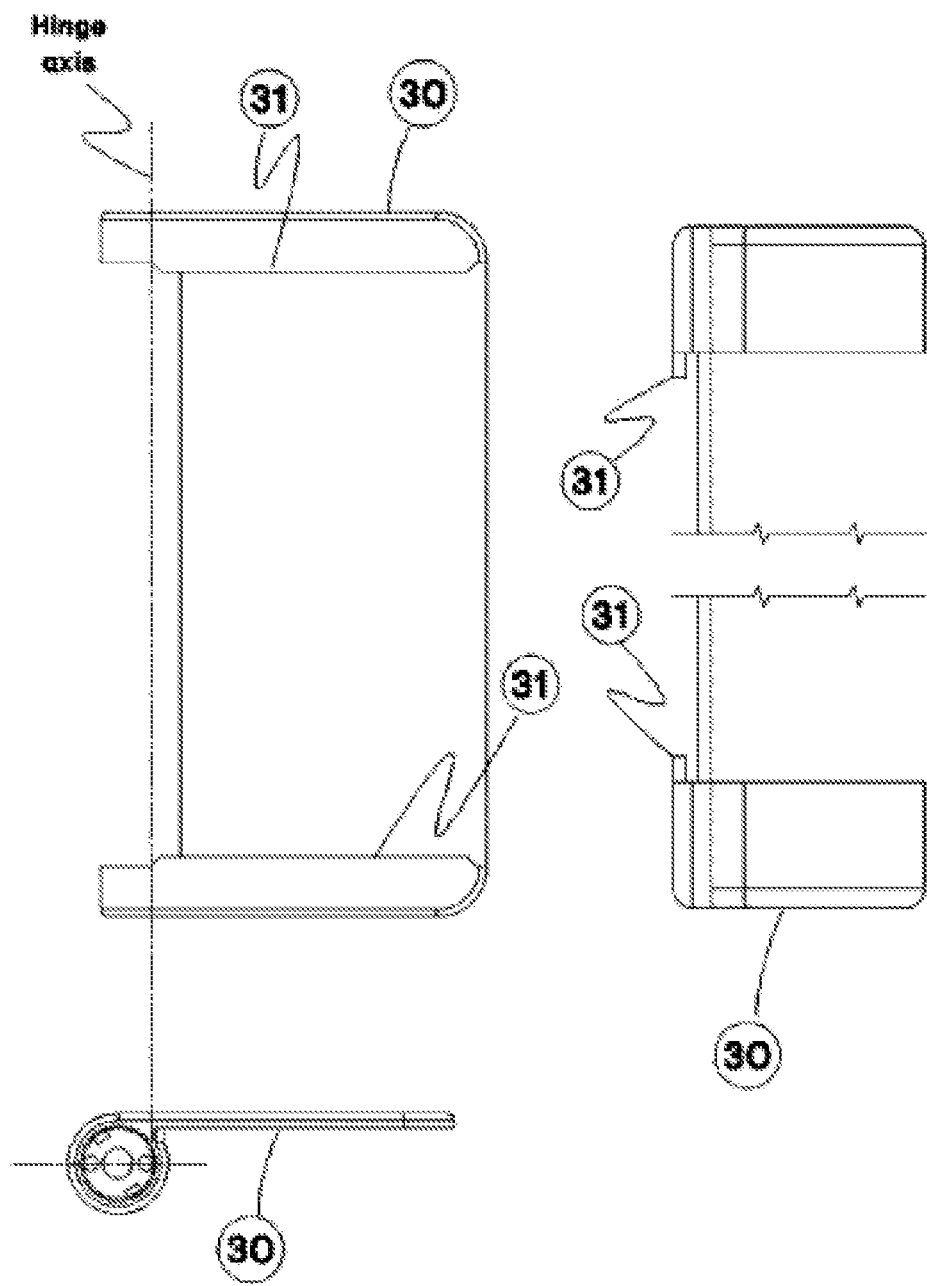
FIG. 7 is a plan view, front view and side view of the cover plate in which overlap is generated upon over-unfolding in FIG. 1.

FIG. 3 is a front view and plan view showing an overlapped portion and separated portion generated when the additional unfolding of the cover plate is forcedly performed in the same unfolding direction after the cover plate is unfolded in the state in which the flexible display means has formed the complete plane in the case of FIG. 1. FIG. 4 is a cross-sectional view of a cross section portion A-A of FIG. 3 and a partial detailed view showing that overlap is generated. FIG. 5 is a cross-sectional view of a cross section portion B-B of FIG. 3 and a partial detailed view showing that overlap is generated. FIG. 6 is a plan view, front view and cross-sectional view of the fixed body in which overlap is generated upon over-unfolding in FIG. 1. FIG. 7 is a plan view, front view and side view of the cover plate in which overlap is generated upon over-unfolding in FIG. 1.

As shown in FIGS. 3, 4 and 5, in the full unfolding state in which the flexible display means 20 forms a complete plane, if the unfolding of the cover plate 30 is to be additionally performed in the same unfolding direction, area overlap may be generated between the fixed body 10 and the cover plate 30, the flexible display means 20 and the sliding latch jaw 32 of the cover plate 30, and the flexible display means 20 and an end portion neighboring the hinge of the fixing plate 40, that is, the elements of FIG. 1. In this case, Y1 is a complete plane-forming angle at which the cover plate 30 maintained in the folding state to the fixed body 10 is unfolded so that the flexible display means 20 forms a complete plane. Y2 is an over-unfolding angle at which after the cover plate 30 is unfolded in the state in which the flexible display means 20 forms a complete plane, the cover plate 30 is over-unfolded in the same unfolding direction.

Furthermore, it may be seen that the center is formed on the opposite side in which the rotation axis of the hinge is located on the basis of a surface in which the flexible display means 20 is fixed to the fixed body and a separation phenomenon in which the flexible display means 20 is separated without being attached or fixed to the fixed body 10 is generated in the section in which a curved surface is formed so that the curved surface of the flexible display means 20 can be formed.

If the phenomenon in which the flexible display means 20 is separated from the fixed body 10 when the cover plate is over-unfolded suppressed, when the cover plate 30 is over-unfolded, the flexible display means 20 is suddenly bent even without minimum curvature. Accordingly, there is a problem in that the flexible display means 20 is broken and malfunctions because minimum curvature of the flexible display means 20 is not secured.

As shown in FIG. 4, in the example of FIG. 1 in which a shape for the over-unfolding of the cover plate 30 has not been incorporated into the elements, assuming that the over-unfolding of the cover plate 30 is forcedly performed, the sliding latch jaw 31 located in the hinge of the cover plate 30 overlaps a portion of the flexible display means 20 which forms a curved surface toward the side opposite the side where the rotation axis of the hinge is located and which is separated and bent.

Furthermore, the top circumference of the flexible display means 20 located in the fixed body 10 is pressed, and overlap generated between an end portion neighboring the hinge of the fixing plate 40 fixed to the fixed body 10 and a portion of the flexible display means which is separated while forming a curved surface toward the side opposite the side where the rotating axis of the hinge is located.

Furthermore, as shown in FIG. 5, in the example of FIG. 1 in which a shape for the over-unfolding of the cover plate 30 has not been incorporated into the elements, assuming that the over-unfolding of the cover plate 30 is forcedly performed, overlap is generated between a portion neighboring the hinge of the cover plate 30 and a portion neighboring the hinge of the fixed body 10.

In order for the overlap shown in FIGS. 4 and 5 to be not generated, portions related to the overlap needs to be removed from the fixed body 10, the cover plate 30 and the fixing plate 40. FIGS. 6 and 7 show the filed body 10 and the cover plate 30 from which the portions related to the overlap have not been removed.

As shown in FIG. 6, the fixed body 10 in which the over-unfolding of the cover plate 30 has not been incorporated has a hinge-adjacent portion shape which is capable of covering a range portion closest to the rotation axis of the hinge so that the hinge shape portion of the cover plate 30 can be rotatably moved and an empty space can be minimized.

Furthermore, a fixing plate support part 11 is formed on one side of the fixed body 10 so that the flexible display means 20 located in the fixed body 10 is pressed and the fixing plate 40 fixed to the fixed body 10 can be fixed to the fixed body 10. It is preferred that the fixing plate support part 11 is formed at the location closest to the rotation axis of the hinge of the fixed body 10 so that the elastic force of the flexible display means 20 supported by the outer surface of the hinge is changed into the sliding force of the flexible display means 20 in the cover plate 30 when the cover plate 30 is unfolded.

As shown in FIG. 7, it is preferred that the sliding latch jaw 31 of the cover plate 30 in which the over-unfolding of the cover plate 30 has not been taken into consideration maintains the plane state out of the outer surface of the hinge, a surface opposite a surface of the flexible display means 20 that is subjected to sliding operation and supported by the cover plate 30 and on which an image is displayed formed from the location that comes into contact with the outer surface of the hinge to a specific length portion that escapes from the hinge rotating axis in the sliding direction of the flexible display means 20, and the surface is formed up to an end portion on one side of the cover plate 30 for the stable sliding operation and support of the flexible display means 20.

Figure 8:
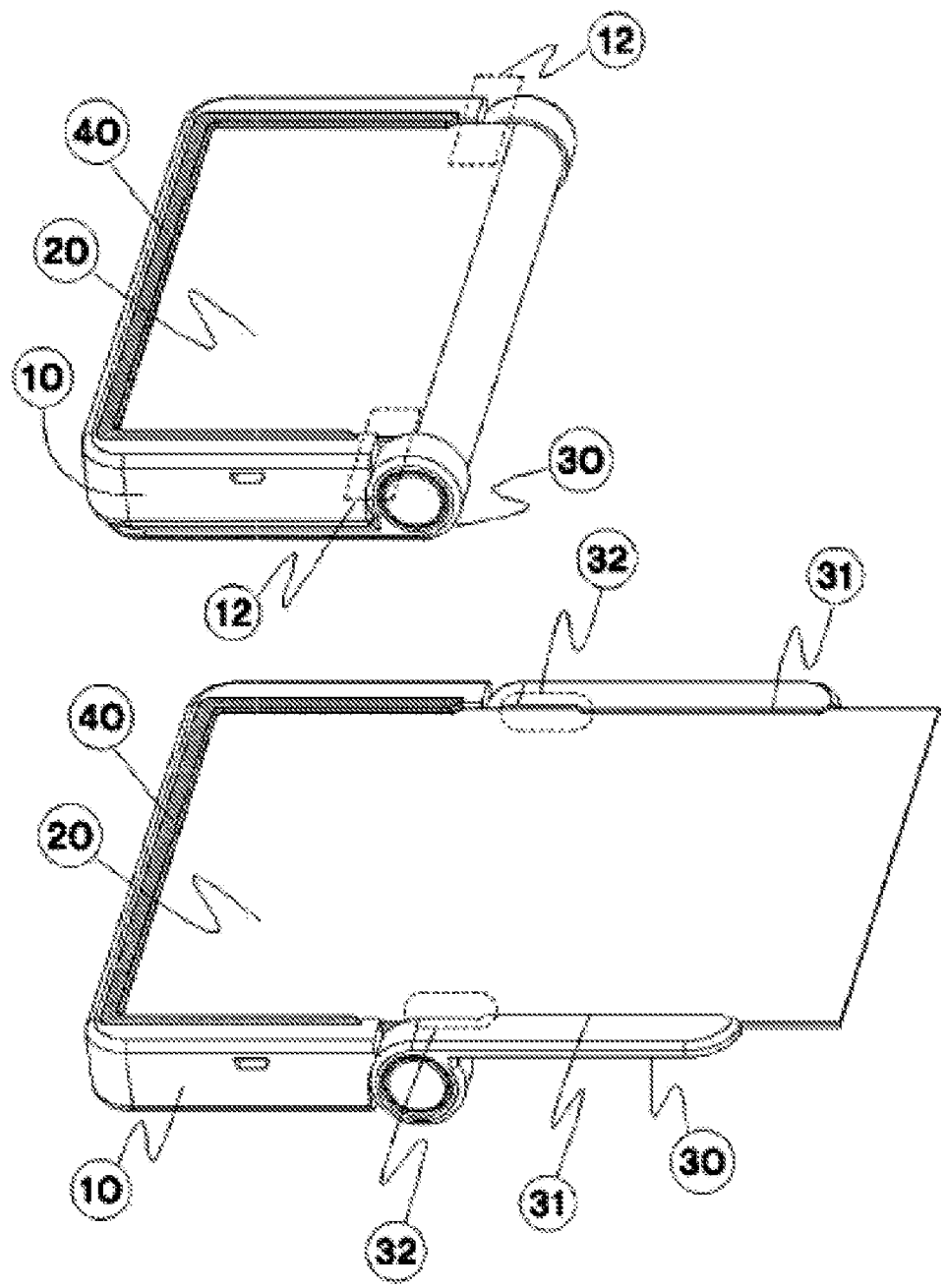
FIG. 8 is a perspective view showing an example which the fixed body, cover plate and fixing plate from which the overlapped portions in FIGS. 3, 4 and 5 have been removed have been applied.
Figure 9:
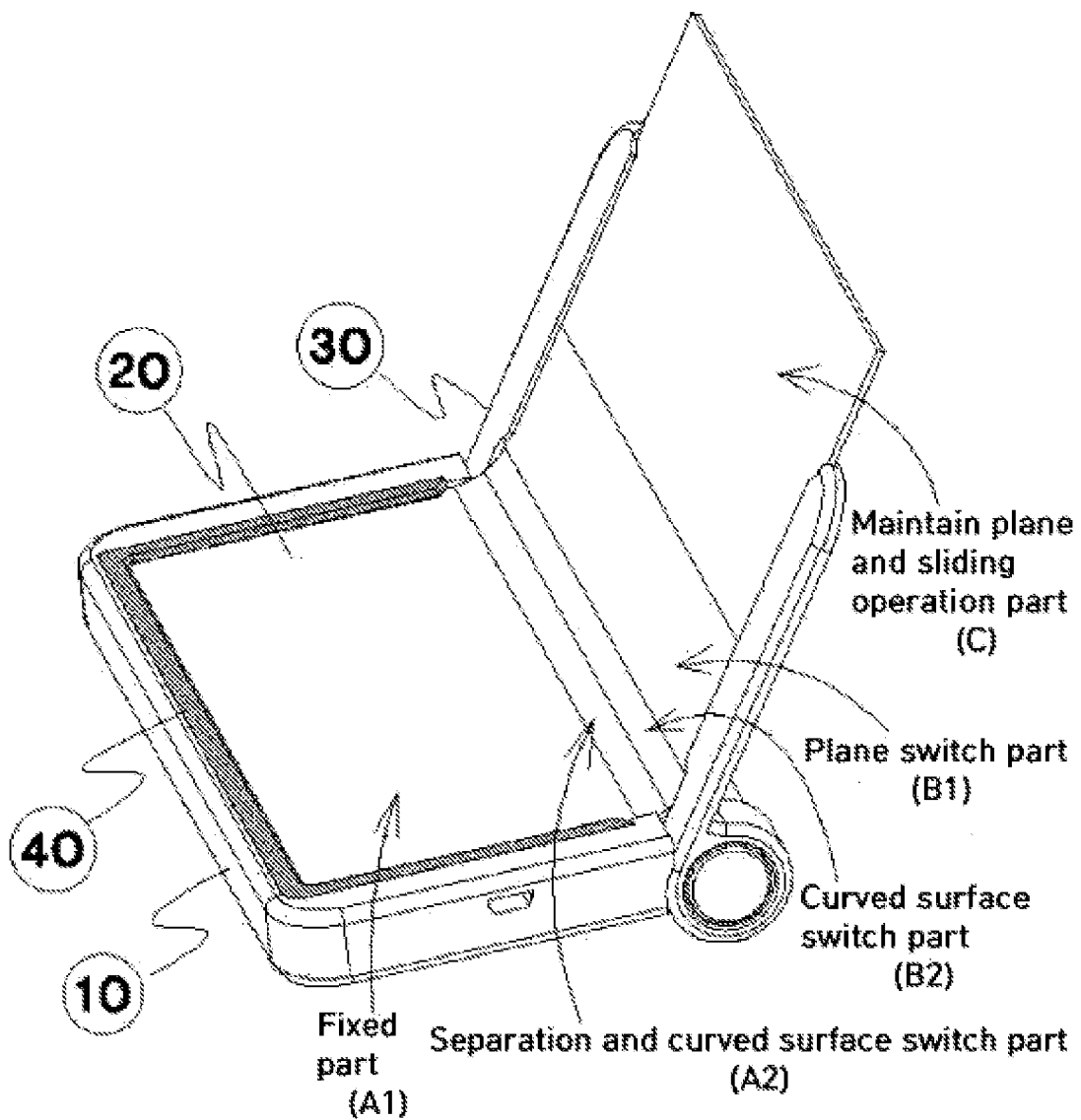
FIG. 9 is a perspective view showing that the overlap generated in FIG. 5 upon over-unfolding in the example of FIG. 8 is not generated.
Figure 10:
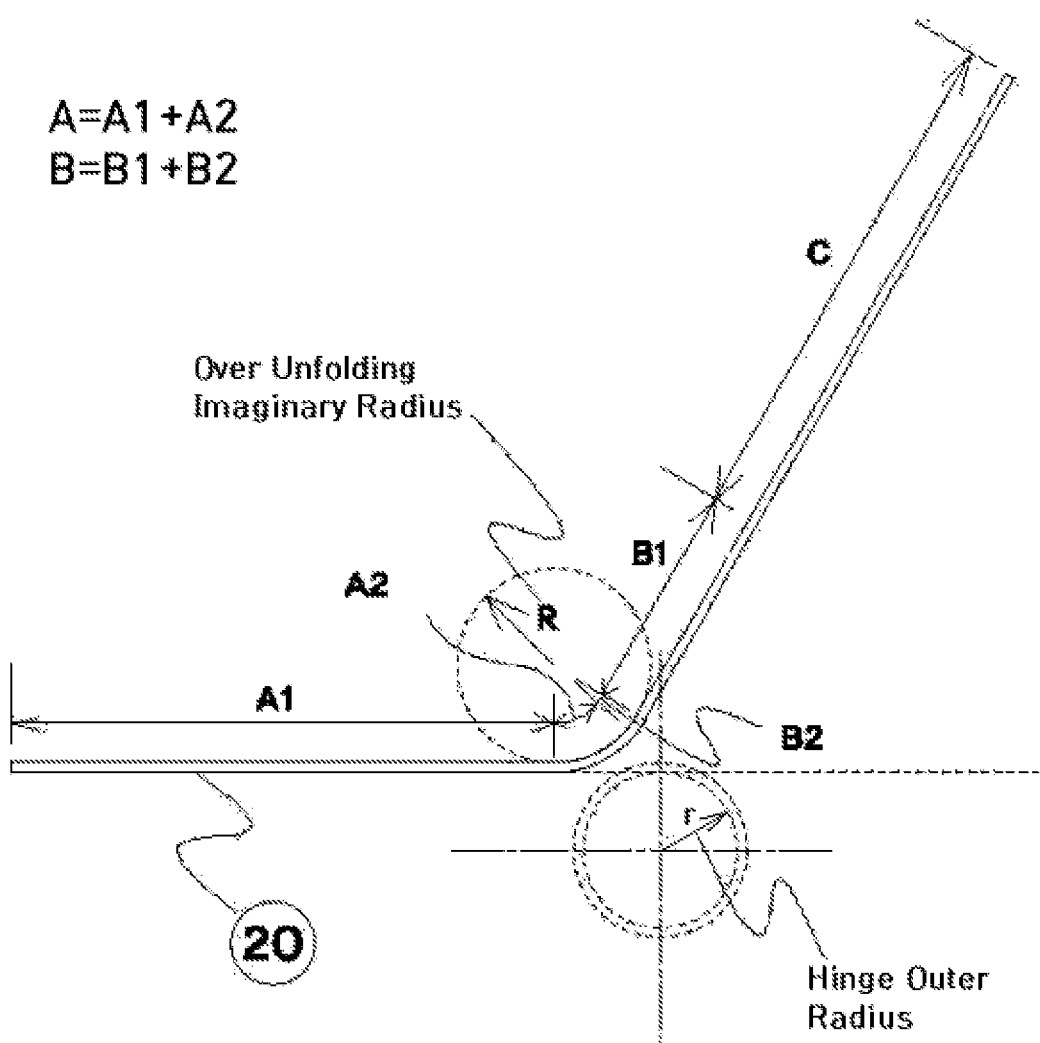
FIG. 10 is a conceptual diagram showing a change for each application section in the flexible display means upon over-unfolding in the example of FIG. 8.

FIG. 8 is a perspective view showing an example in which the fixed body, cover plate and fixing plate from which the overlapped portions in FIGS. 3, 4 and 5 have been removed have been applied, FIG. 9 is a perspective view showing that the overlap generated in FIG. 5 upon over-unfolding in the example of FIG. 8 is not generated, and FIG. 10 is a conceptual diagram showing a change for each application section in the flexible display means upon over-unfolding in the example of FIG. 8.

As shown in FIGS. 8 and 9, if portions in which interference is generated are removed upon over-unfolding the flexible display means 20, the flexible display means 20 can maintain the full unfolding state that forms a complete plane because the cover plate 30 is unfolded in the state in which the flexible display means 20 has formed the complete plane. Thereafter, over-unfolding in which the cover plate 30 is additionally unfolded in the same unfolding direction is made possible and the following advantages are obtained.

First, stereoscopic watching is made possible because a surface on which an image is displayed is not a complete plane, but can be adjusted to have a smooth V shape based on the rotation axis of the hinge.

Second, in addition to portable convenience in which the flexible display means 20 is folded and carried, one portion of a surface on which an image is displayed can be inclined and erected like a notebook, and the other portion of the surface can maintain an unfolded posture to facilitate a user's touch input.

The over-unfolding of the flexible display means 20 having such advantages is performed in such a manner that the entire surface on which an image is displayed is unfolded from the state in which the flexible display means 20 has been folded to the state in which the entire surface forms a complete plane and then the cover plate is additionally unfolded in the same rotating direction.

As shown in FIGS. 9 and 10, after the flexible display means 20 is unfolded from the state in which it has been folded to the state in which it forms a complete plane, if the cover plate 30 is additionally unfolded in the same rotating direction, a portion that belongs to the flexible display means 20 and that comes into contact with the outer surface of the hinge has the center on the side opposite the side where the rotation axis of the hinge is located on the basis of a surface in which the flexible display means 20 is fixed to the fixed body 10 without being supported by the outer surface of the hinge, and is thus bent while forming a curved surface.

In this state, the portion A of the flexible display means 20 shown in FIG. 10 is divided into a portion A1 fixed to the fixed body 10 in the plane state and a portion A2 separated from one surface of the fixed body 10, erected and changed into the curved surface.

Unlike the portion A1 that maintains the plane state, the portion A2 which has the center on the side opposite the side where the rotation axis of the hinge is located and which is bent while forming a curved surface of minimum curvature R is not attached or fixed to one surface of the fixed body 10 in order to form the curved surface, but maintains the state in which the portion A2 has been separated from the one surface of the fixed body 10 when the cover plate 30 is over-unfolded.

The portion A2, that is, a separation area 21 that needs to maintains the separation state, has to have a minimum range from the outer surface of the hinge and a portion coming into contact with a surface opposite the surface that belongs to the flexible display means 20 and on which an image is displayed to an end at which the portion A2 is ended in the fixed body 10.

The portion B of the flexible display means 20 shown in FIG. 10 is divided into a portion B1, that is, a portion subjected to a sliding operation and supported by the cover plate 30 while maintaining a plane state, and a portion B2 which forms a curved surface toward the side opposite the side where the rotation axis of the hinge located and which is bent and escapes from the outer surface of the hinge.

Area overlap with the sliding latch jaw 31 is not generated in the portion B1, whereas area overlap with the sliding latch jaw 31 may be generated in the portion B2. Accordingly, a related portion is removed from a portion of the sliding latch jaw 31 corresponding to the portion B2 in order to avoid area overlap.

The portion C of the flexible display means 20 shown in FIG. 10 always maintains a plane state regardless of whether the cover plate 30 has been additionally unfolded and maintains the state in which it is subjected to a sliding operation and supported by the cover plate 30.

Figure 11:
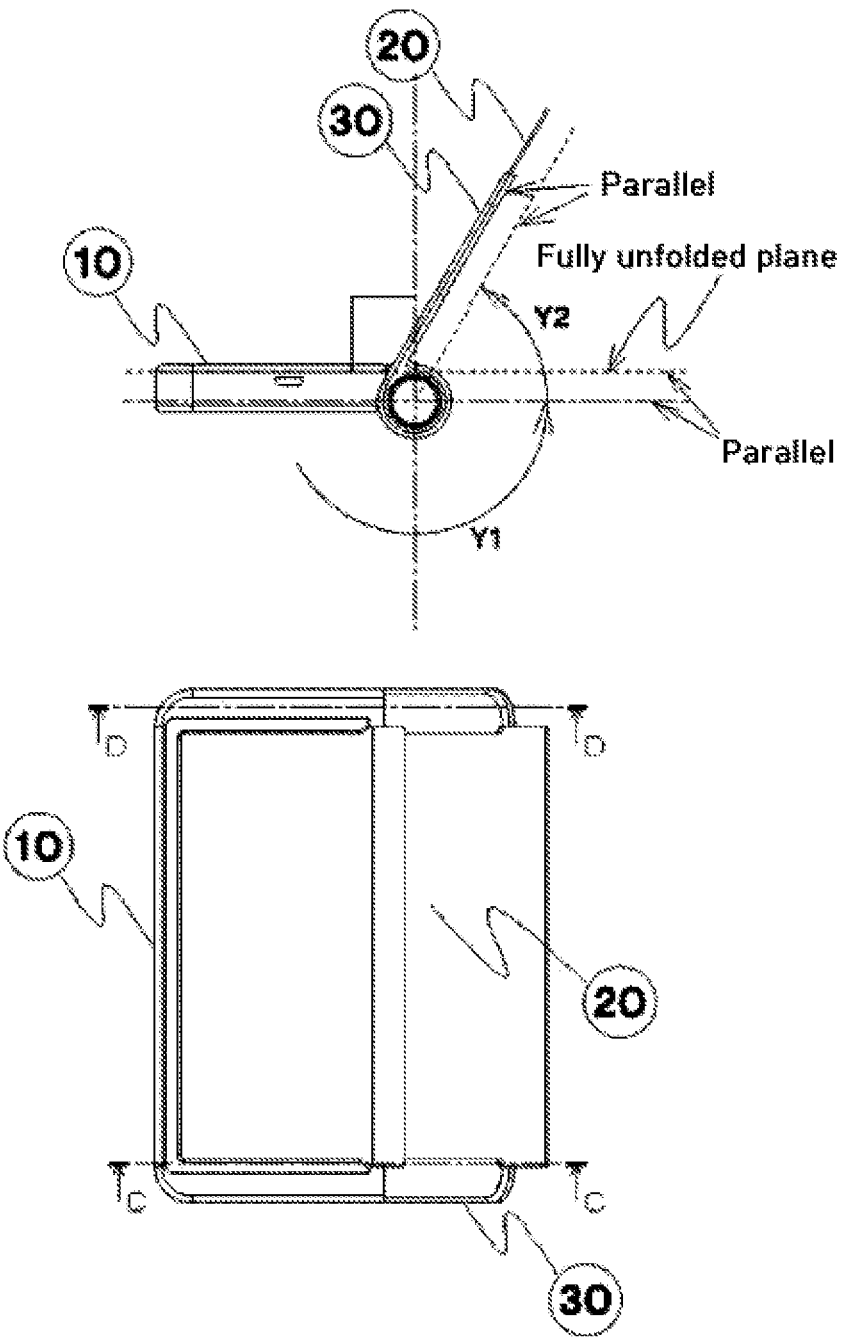
FIG. 11 is a plan view and front view showing that overlap is not generated when over-unfolding is performed at an angle greater than an angle at which full unfolding is formed in the case of FIG. 8.
Figure 12:
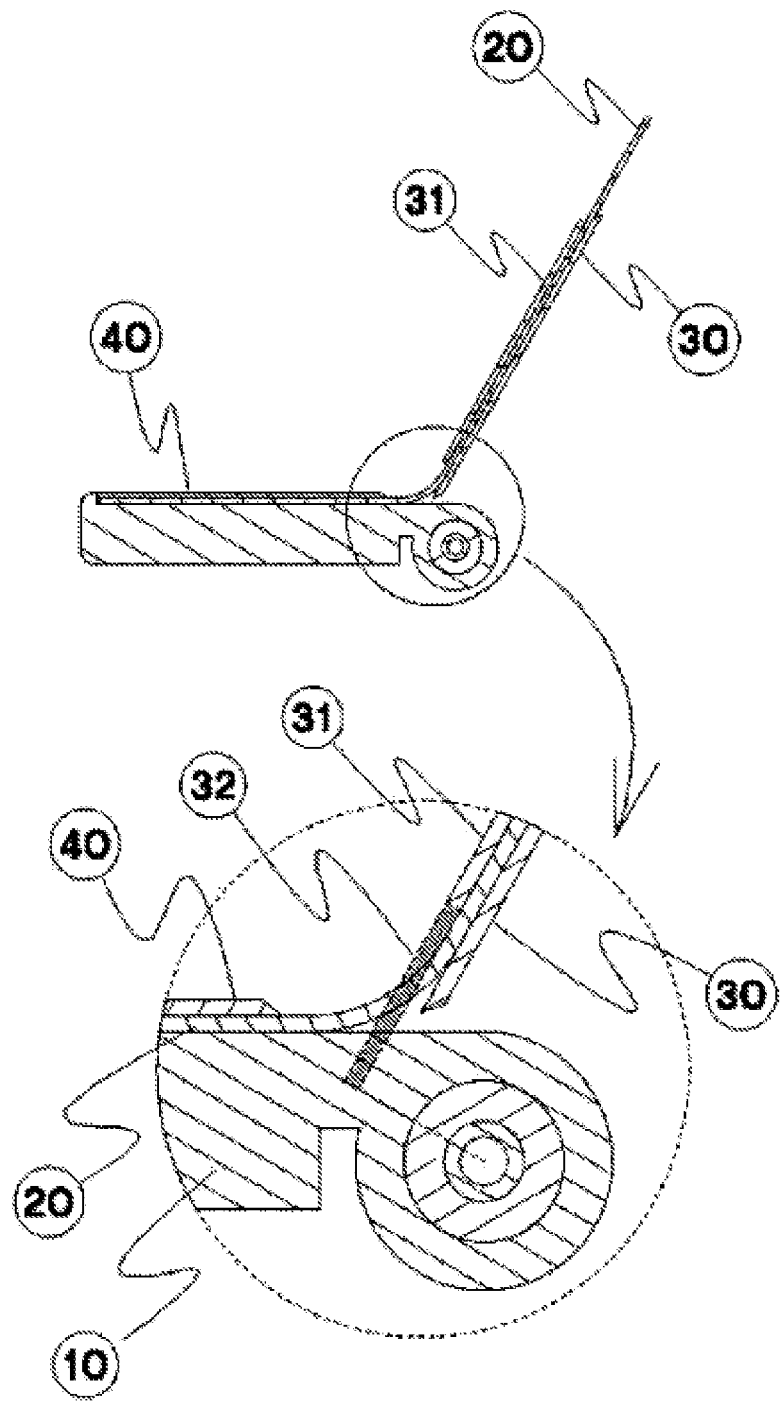
FIG. 12 is a cross-sectional view of a cross section portion C-C of FIG. 11 and a partial detailed view showing that overlap is not generated, FIG. 13 Is a cross-sectional view or cross section portion D-D of FIG. 11 and a partial detailed view showing that overlap is not generated.
Figure 13:
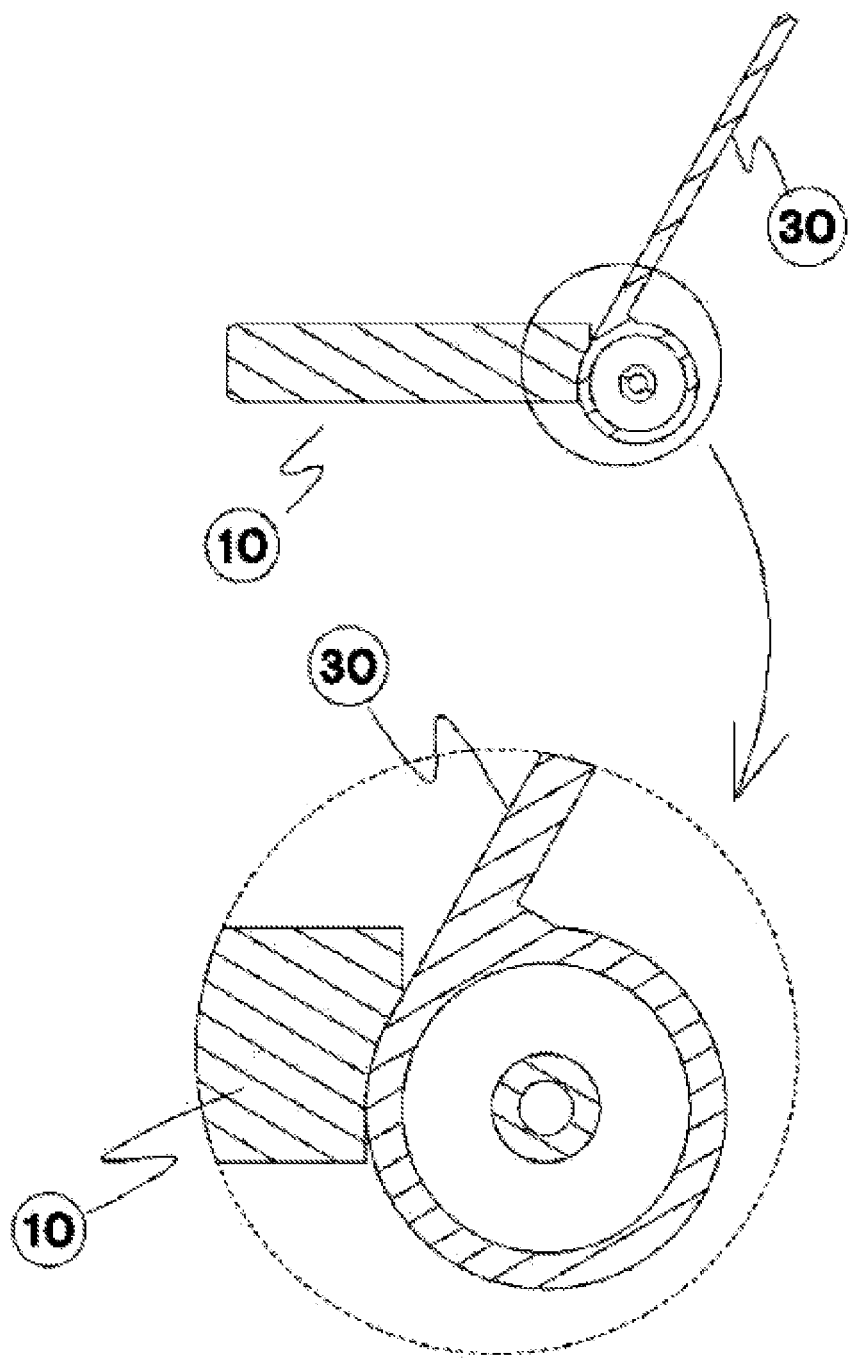

FIG. 11 is a plan view and front view showing that overlap is not generated when over-unfolding is performed at an angle greater than an angle at which full unfolding is formed in the case of FIG. 8. FIG. 12 is a cross-sectional view of a cross section portion C-C of FIG. 11 and a partial detailed view showing that overlap is not generated. FIG. 13 is a cross-sectional view of a cross section portion D-D of FIG. 11 and a partial detailed view showing that overlap is not generated.

As shown in FIG. 12, if the overlap-related portions of the sliding latch jaw 31 that overlap the portions A2 and B2 of the flexible display means 20 are removed, although the flexible display means 20 is fully unfolded and the cover plate is then additionally turned in the same rotating direction and over-unfolded, the flexible display means 20 can be bent without interference while forming a curved surface toward the side opposite the side where the rotation axis of the hinge is located.

Furthermore, as shown in FIGS. 9 and 12, if the application location is limited out of the area A2 so that the circumference of the flexible display means 20 located on one surface of the fixed body 10 is pressed and the end of the fixing plate 40 fixed to the fixed body 10 does not overlap the portions A2 and B2 of the flexible display means 20, although the flexible display means 20 is fully unfolded and the cover plate 30 is then additionally turned in the same rotating direction and over-unfolded, the flexible display means 20 can be bent while forming a curved surface toward the side opposite the side where the rotation axis of the hinge is located.

As shown in FIG. 13, if a first space 12 for interference avoidance is removed from a portion neighboring the hinge of the fixed body 10 so that a portion neighboring the hinge of the cover plate 30 does not overlap the portion neighboring the hinge of the fixed body 10, although the flexible display means 20 is fully unfolded and the cover plate 30 is then additionally turned in the same rotating direction and over-unfolded, the flexible display means 20 can be bent while forming a curved surface toward the side opposite the side where the rotation axis of the hinge is located.

Figure 14:
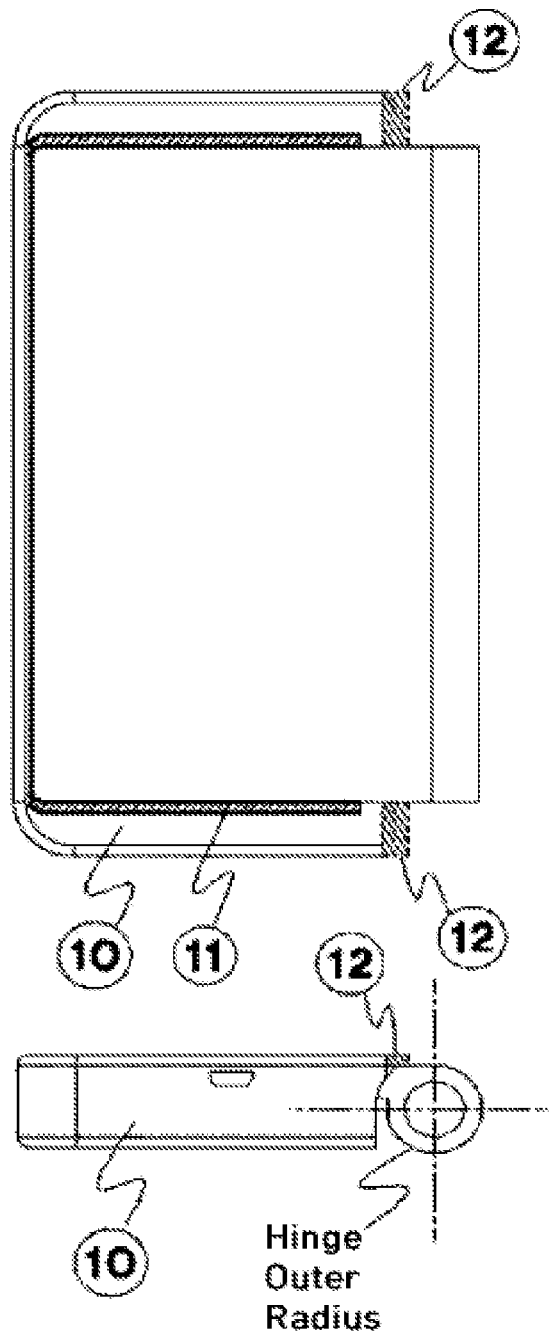
FIG. 14 is a plan view and front view of the fixed body from which the overlapped portions have been removed to enable over-unfolding in the example of FIG. 8.
Figure 15:
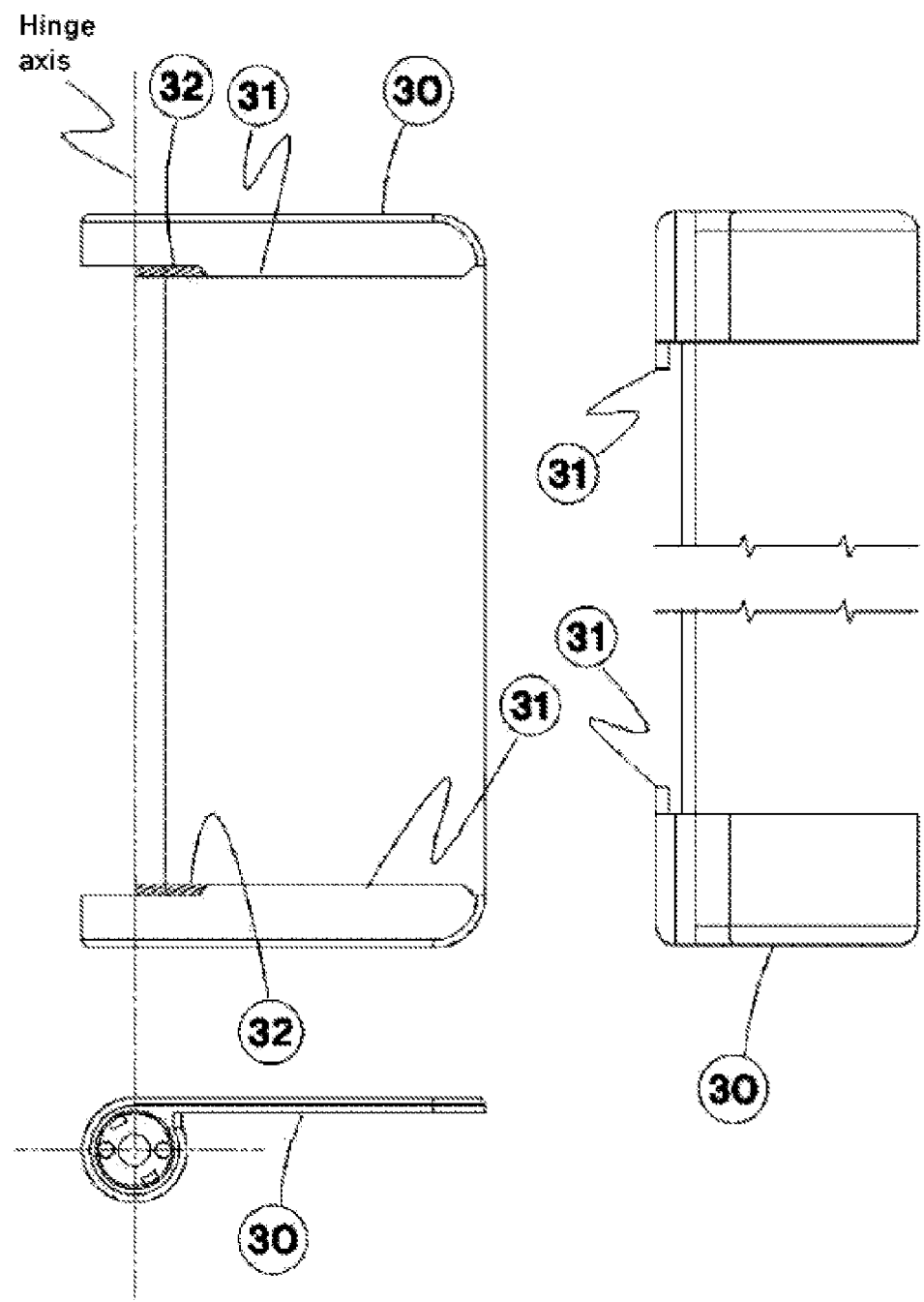
FIG. 15 is a plan view, front view and side view of the cover plate from which the overlapped portions have been removed to enable over-unfolding in the example of FIG. 8.
Figure 16:
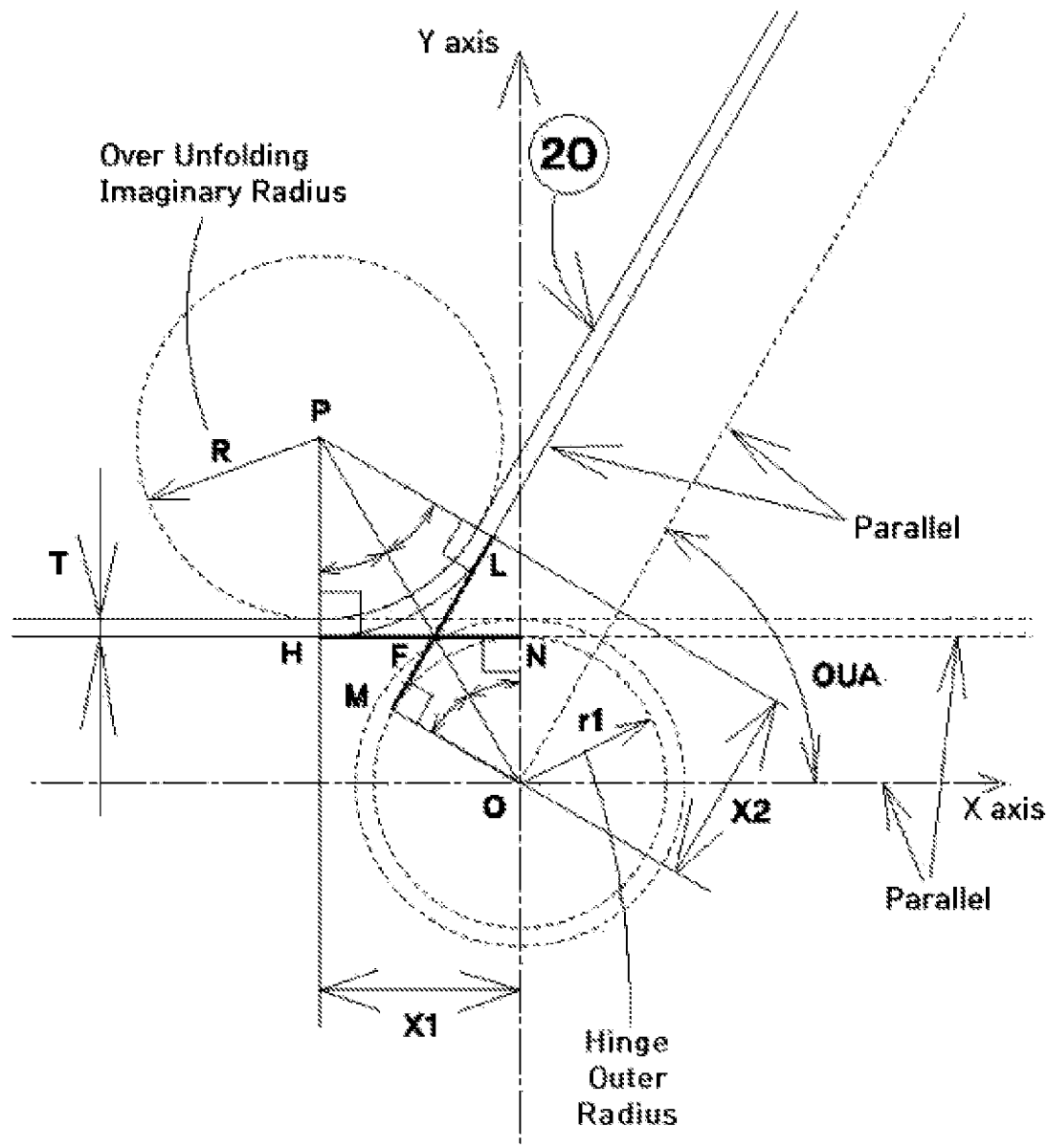
FIG. 16 is a conceptual diagram geometrically showing an overlapped portion that needs to be removed to enable over unfolding in the example of FIG. 8.

FIG. 14 is a plan view and front view of the fixed body from which the overlapped portions have been removed to enable over-unfolding in the example of FIG. 8. FIG. 15 is a plan view, front view and side view of the cover plate from which the overlapped portions have been removed to enable over-unfolding in the example of FIG. 8. FIG. 16 is a conceptual diagram geometrically showing an overlapped portion that needs to be removed to enable over-unfolding in the example of FIG. 8.

As shown in FIG. 14, the first space 12 for interference avoidance from which a specific area has been removed, for avoiding the occurrence of overlap with the cover plate 30 when the cover plate 30 is over-unfolded, is incorporated into the portion neighboring the hinge of the fixed body 10. Furthermore, the range in which the fixing plate support part 11 and the end portion neighboring the hinge of the fixing plate 40 are applied is limited so that the end of the fixing plate 40 does not overlap the portions A2 and B2 of the flexible display means 20.

As shown in FIG. 15, the sliding latch jaw 31 from which a second space 32 for interference avoidance has been removed is incorporated from the outer surface of the hinge and a portion with which a surface opposite a surface of the flexible display means 20 on which an image is displayed comes into contact to a minimum range or more in which the portion B1 of the flexible display means 20 is started so that the portions A2 and B2 of the flexible display means 20 do not overlap the portion of the sliding latch jaw 31 of the cover plate 30.

If the flexible display means 20 is fully unfolded and the cover plate 30 is then additionally turned in the same rotating direction and over-unfolded, the flexible display means 20 maintains minimum curvature in the portion where a curved surface is formed, and maintains a geometrical relation as shown in FIG. 16 assuming that interference attributable to overlap is not present.

In order to describe the geometrical relation of the flexible display means 20 shown in FIG. 16, indication letters are defined as follows using a cartesian coordinate system based on a center point O.

O is the center point of the rotation axis of the hinge of the fixed body 10.

P is the center point of a curved surface of the flexible display means 20 which is formed with the center on the side opposite the side where the rotation axis of the hinge is located based on a surface by which the flexible display means 20 is fixed to the fixed body 10 when the over-unfolding of the cover plate 30 is completed.

r is the radius of the outer surface of the hinge of the fixed body 10 and the cover plate 30.

R is the curved radius of a surface that belongs to the flexible display means 20 and on which an image is displayed and which is formed with the center on the side opposite the side where the rotation axis of the hinge is located based on a surface by which the flexible display means 20 as fixed to the fixed body 10 when the over-unfolding of the cover plate 30 is completed. R may have the same value as or different from r.

OUA is an over-unfolding angle.

T is the thickness of the flexible display means 20 on which a sealing process has been completed.

N is an intersection point at which the surface opposite the surface that belongs to the flexible display means 20 and on which an image is displayed comes into contact with the outer surface of the hinge an the state in which the flexible display means 20 forms a complete plane.

H is a contact point at which a portion of the flexible display means 20 located in the fixed body 10 starts to be separated from one surface of the fixed body 10 with the curved surface of the radius R and to be changed into a curved surface when the over-unfolding of the cover plate 30 is completed.

L is a contact point at which a surface opposite a surface that is located in the cover plate 30, that belongs to the flexible display means 20 and on which an image is displayed starts to be changed into a curved surface, while maintaining a radius of R+T, when the over-unfolding of the cover plate 30 is completed.

P is the location where the intersection point N has moved to the fixed body 10 when the over-unfolding of the cover plate 30 is completed.

F is the intersection point of a segment ML and a segment HN.

A closed area consisting of a fan shape MN having the center point O, the intersection point M, the intersection point F and the intersection point N is a minimum area that needs to be included in the first space 12 for interference avoidance.

X1 is the length of the segment HN and is a minimum distance of the separation area 21 in which the end of the fixing plate 40 needs to be spaced apart from the intersection point N X2 is the length of the segment ML and is a minimum distance of the second space 32 for interference avoidance in which the sliding latch jaw 31 of the cover plate 30 starts to be formed while maintaining the distance spaced apart from the intersection point N.

In FIG. 16, a triangle OFN, a triangle OFM, a triangle PFH and a triangle PFL are similar right-angle triangles, and each FON=each FOM=each FPH=each FPL=½×OUA.

The X-axis and Y-axis coordinates of the intersection point N, intersection point F and intersection point M are calculated as follows using a trigonometrical function.

The X-axis coordinates of the intersection point N is 0, and the Y-axis coordinates thereof are r, the X-axis coordinates of the intersection point F are −r×tan(½×OUA) and the Y-axis coordinates thereof are 0, and the X-axis coordinates of the intersection point M is −r×sin(OUA), and the Y-axis coordinates thereof are r×cos (OUA).

From FIG. 16, it may be seen that the portion of a square OMFN needs to be removed to a minimum extent in the shape of a portion neighboring the hinge of the fixed body 10 so that a portion neighboring the hinge of the cover plate 30 does not overlap a portion neighboring the hinge of the fixed body 10 and the cover plate 30 is over-unfolded.

However, the fan shape OMN is a portion that has already been removed from the portion of the fixed body 10 for the rotatable movement of the shape of the hinge portion of the cover plate 30. Accordingly, an actual portion that has to be additionally removed is a portion that belongs to the portion of the square OMFN and from which the fan shape OMN has been excluded. As a result, it may be seen that a minimum area of the first space 12 for interference avoidance is a closed area consisting of the fan shape MN having the center point O, the intersection point N, the intersection point F and the intersection point N. Furthermore, the length of a segment X1 is calculated as follows using a trigonometrical function.

$$\begin{aligned} X1 = & \text{ length of segment } PH \times \tan\,(\text{each } FPH) + \\ & \text{ length of segment } ON \times \tan\,(\text{each } FON) \\ = & \{\text{over-unfolding imaginary radius } (R) + T\} \times \tan(1/2 \times OUA) + \\ & \text{ radius } (r) \text{ of hinge outer surface of fixed body and cover plate} \times \\ & \tan(1/2 \times OUA) \\ = & (R + r + T) \times \tan(1/2 \times OUA) \end{aligned}$$

In this case, X1 is a minimum distance of the separation area 21 by which the end of the fixing plate 40 has to be spaced apart from the intersection point N.

Accordingly, the minimum distance of the separation area 21=(R+r+T)×tan (½×OUA). Likewise, the length of a segment X2 is calculated as follows.

$$X2 = \text{length of segment } OM \times \tan(\text{each } FOM) +$$
$$\text{length of segment } PL \times \tan(\text{each } FPL)$$
$$= \text{radius }(r)\text{ of hinge outer surface of fixed body and cover plate} \times$$
$$\tan(1/2 \times OUA) + \{\text{over-unfolding imaginary radius }(R) + \text{thickness}$$
$$(T) \text{ of flexible display means}\} \times \tan(1/2 \times OUA) +$$
$$= (R + r + T) \times \tan(1/2 \times OUA)$$

In this case, X2 is a minimum distance of the second space 32 for interference avoidance in which the sliding latch jaw 31 of the cover plate 30 has to start to be formed while maintaining the distance spaced apart from the intersection point N. Accordingly, the minimum distance of the second space 32 for interference avoidance=(R+r+T)×tan (½× OUA).

A folding detection sensor 50 functions to detect an unfolding angle of the cover plate 30 and to send the detected unfolding angle to a controller that has not been shown and described. The controller is not shown in the drawings describing the embodiments of the present invention.

Although the embodiments of the present invention have been described above with reference to the accompanying drawings, those skilled in the art to which the present invention pertains will appreciate that the present invention may be implemented in other detailed forms without departing from the technological spirit or essential characteristics of the present invention. Accordingly, the aforementioned embodiments should be understood as being only illustrative, but should not be understood as being restrictive from all aspects.

The invention claimed is:

1. A flexible display apparatus, comprising:
a fixed body having a hinge disposed at an edge on one side of the fixed body;
a cover plate assembled to the hinge of the fixed body so that the cover plate is rotatable relative to the fixed body, the cover plate including a sliding guide; and
flexible display means having a first portion fixed to the fixed body, a second portion that is configured to be folded when the cover plate rotates relative to the fixed body, and a third portion that is configured to slide relative to the cover plate when the cover plate rotates relative to the fixed body, the third portion being slidably engaged into the sliding guide,
wherein the cover plate is configured to rotate relative to the fixed body in an unfolding direction beyond an angle at which the first, second and third portions of the flexible display means form a plane.

2. The flexible display apparatus of claim 1, wherein the fixed body comprises a first space for interference avoidance which is an area removed to prevent area interference with the cover plate so that the cover plate is configured to rotate relative to the fixed body in the unfolding direction beyond an angle at which the first, second, and third portions of the flexible display means form the plane.

3. The flexible display apparatus of claim 1, wherein:
the sliding guide comprises a second space for interference avoidance which is an area removed to prevent area interference between a portion where a curved surface of the flexible display means is formed and the sliding guide so that the cover plate is configured to rotate relative to the fixed body in the unfolding direction beyond an angle at which the first, second, and third portions of the flexible display means form the plane.

4. The flexible display apparatus of claim 1, further comprising a fixing plate that is fixed to the fixed body and secures a rim of the first portion of the flexible display means to the fixed body.

5. The flexible display apparatus of claim 1, wherein when the cover plate rotates relative to the fixed body in the unfolding direction beyond an angle at which the first, second, and third portions of the flexible display means form the plane, a second portion of the flexible display means forms a separation area, the separation area is detached from the fixed body and forms a curved surface having a center out of a surface of the fixed body.

6. The flexible display apparatus of claim 2, wherein in a cartesian coordinate system based on a center point 0, comprising:
O is a center point of a rotation axis of the hinge of the fixed body,
P is a center point of a curved surface of the flexible display means formed with a center on a side opposite the side where the rotation axis of the hinge is located based on a surface by which the flexible display means is fixed to the fixed body when an over-unfolding of the cover plate is completed,
r is a radius of an outer surface of the hinge of the fixed body and the cover plate,
R is radius of a curved surface that belongs to the flexible display means, on which an image is displayed and which is formed with the center on the side opposite the side where the rotation axis of the hinge is located based on the surface by which the flexible display means is fixed to the fixed body when the over-unfolding of the cover plate is completed,
OUA is the over-unfolding angle,
T is a thickness of the flexible display means on which a sealing process has been completed,
N is an intersection point at which a surface opposite the surface that belongs to the flexible display means and on which an image is displayed comes into contact with the outer surface of the hinge in the state in which the flexible display means has formed a complete plane,
H is a contact point at which a portion of the flexible display means located in the fixed body starts to be separated from one surface of the fixed body with the curved surface of the radius R and to be changed into the curved surface when the over-unfolding of the cover plate is completed,
L is a contact point at which the surface opposite the surface that is located in the cover plate, that belongs to the flexible display means and on which an image is displayed starts to be changed into the curved surface, while maintaining a radius of R+T, when the over-unfolding of the cover plate is completed,
M is a location where the intersection point N has moved to the fixed body when the over-unfolding of the cover plate is completed, and
F is an intersection point of a segment ML and a segment HN,
wherein the first space for interference avoidance is formed to have a closed area comprising:
X-axis coordinates of the intersection point N are 0, and Y-axis coordinates thereof are r, X-axis coordinates of the intersection point F are −r×tan (½× OUA) and Y-axis coordinates thereof are 0, and X-axis coordinates of the intersection point M are $-r \times \sin$ (OUA), and the Y-axis coordinates thereof are $r \times \cos$ (OUA).

7. The flexible display apparatus of claim 3, wherein in a cartesian coordinate system based on a center point 0, comprising:
    O is a center point of a rotation axis of the hinge of the fixed body,
    r is a radius of an outer surface of the hinge of the fixed body and the cover plate,
    R is a radius of a curved surface that belongs to the flexible display means, on which an image is displayed and which is formed with a center on a side opposite the side where the rotation axis of the hinge is located based on a surface by which the flexible display means is fixed to the fixed body when an over-unfolding of the cover plate is completed,
    OUA is the over-unfolding angle,
    T is a thickness of the flexible display means on which a sealing process has been completed, and
    N is an intersection point at which a surface opposite the surface that belongs to the flexible display means and on which an image is displayed comes into contact with the outer surface of the hinge in the state in which the flexible display means has formed a complete plane,
    wherein N-axis coordinates of the intersection point N are 0 and Y-axis coordinates thereof are r, and
    the second space for interference avoidance is formed by removing a portion comprising a distance of $(R+r+T) \times \tan (½ \times OUA)$ from the sliding guide in a direction in which the flexible display means slides from the intersection point N while becoming distant from the rotation axis of the hinge.

8. The flexible display apparatus of claim 4, wherein in a cartesian coordinate system based on a center point 0, comprising:
    O is a center point of a rotation axis of the hinge of the fixed body,
    r is a radius of an outer surface of the hinge of the fixed body and the cover plate,
    R is a radius of a curved surface that belongs to the flexible display means, on which an image is displayed and which is formed with a center on a side opposite the side where the rotation axis of the hinge is located based on a surface by which the flexible display means is fixed to the fixed body when an over-unfolding of the cover plate is completed,
    OUA is the over-unfolding angle,
    T is a thickness of the flexible display means on which a sealing process has been completed, and
    N is an intersection point at which a surface opposite the surface that belongs to the flexible display means and on which an image is displayed comes into contact with the outer surface of the hinge in the state in which the flexible display means has formed a complete plane,
    wherein N-axis coordinates of the intersection point N are 0 and Y-axis coordinates thereof are r, and
    an end portion neighboring the hinge of the fixing plate becomes distant from the rotation axis of the hinge in one surface of the fixed body to which a portion of the flexible display means has been fixed while forming a plane from the intersection point N, and is located out of an area having a distance of $r \times \tan (½ \times OUA) + (R+T) \times \tan (½ \times OUA)$.

9. The flexible display apparatus of claim 5, wherein in a cartesian coordinate system based on a center point 0, comprising:
    O is a center point of a rotation axis of the hinge of the fixed body,
    r is a radius of an outer surface of the hinge of the fixed body and the cover plate,
    R is a radius of a curved surface that belongs to the flexible display means, on which an image is displayed and which is formed with a center on a side opposite the side where the rotation axis of the hinge is located based on a surface by which the flexible display means is fixed to the fixed body when an over-unfolding of the cover plate is completed,
    OUA is the over-unfolding angle,
    T is a thickness of the flexible display means on which a sealing process has been completed, and
    N is an intersection point at which a surface opposite the surface that belongs to the flexible display means and on which an image is displayed comes into contact with the outer surface of the hinge in the state in which the flexible display means has formed a complete plane,
    wherein N-axis coordinates of the intersection point N are 0 and Y-axis coordinates thereof are r, and
    the separation area becomes distant from the rotation axis of the hinge in one surface of the fixed body to which a portion of the flexible display means has been fixed while forming a plane from the intersection point N, and comprises an area having a distance of $r \times \tan (½ \times OUA) + (R+T) \times \tan (½ \times OUA)$ and a width of the flexible display means.

* * * * *